(12) United States Patent
Takano et al.

(10) Patent No.: US 8,944,147 B2
(45) Date of Patent: Feb. 3, 2015

(54) HEAT EXCHANGER AND METHOD FOR MANUFACTURING SAME

(75) Inventors: Yuya Takano, Nishio (JP); Yasuji Taketsuna, Okazaki (JP); Eisaku Kakiuchi, Toyota (JP); Katsuhiko Tatebe, Seto (JP); Masahiro Morino, Okazaki (JP); Tomohiro Takenaga, Toyota (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 255 days.

(21) Appl. No.: 13/699,971

(22) PCT Filed: May 28, 2010

(86) PCT No.: PCT/JP2010/059119
§ 371 (c)(1),
(2), (4) Date: Nov. 26, 2012

(87) PCT Pub. No.: WO2011/148505
PCT Pub. Date: Dec. 1, 2011

(65) Prior Publication Data
US 2013/0068434 A1    Mar. 21, 2013

(51) Int. Cl.
*F28F 3/02* (2006.01)
*F28F 3/12* (2006.01)
*H01L 23/473* (2006.01)

(52) U.S. Cl.
CPC ........ *F28F 3/002* (2013.01); *F28F 3/027* (2013.01); *F28F 3/025* (2013.01); *F28F 3/12* (2013.01); *H01L 23/473* (2013.01); *F28F 2280/04* (2013.01); *F28F 2265/32* (2013.01)
USPC ......... 165/78; 165/76; 165/80.4; 165/109.1; 165/170; 361/699; 29/890.09

(58) Field of Classification Search
CPC .................... F28F 3/027; F28F 2280/04
USPC .......... 165/76, 78, 80.4, 109.1, 170; 361/699; 29/890.03
See application file for complete search history.

(56) References Cited

U.S. PATENT DOCUMENTS 1,998,663 A * 4/1935 Emmons et al. ............ 165/153
3,731,736 A * 5/1973 Fernandes ................. 165/166
(Continued)

FOREIGN PATENT DOCUMENTS

JP    61-115874 U    7/1986
JP    05-340686 A    12/1993
(Continued)

OTHER PUBLICATIONS

International Search Report of PCT/JP2010/059119 mailed Aug. 17, 2010.

*Primary Examiner* — Allen Flanigan
(74) *Attorney, Agent, or Firm* — Kenyon & Kenyon LLP

(57) ABSTRACT

In a heat exchanger, fins are simply and accurately positioned in place and heat is efficiently exchanged without increasing manufacture cost, and the plurality of corrugated plate-like fins are disposed in the flow direction of a coolant in a housing. The heat exchanger has: connecting parts, which connect together the adjacent fins among the fins; protrusions formed on the connecting parts; and positioning holes for positioning the fins formed in the housing. The adjacent fins are disposed at predetermined intervals in the coolant flow direction with a predetermined offset amount in the direction that orthogonally intersects the coolant flow direction by fitting the protrusions in the positioning holes.

5 Claims, 8 Drawing Sheets

(56) References Cited

U.S. PATENT DOCUMENTS

| | | | |
|---|---|---|---|
| 5,419,041 A * | 5/1995 | Ozeki | 29/890.03 |
| 7,360,837 B1 * | 4/2008 | Liu | 297/353 |
| 8,056,614 B2 * | 11/2011 | Chen et al. | 165/80.3 |
| 2003/0159806 A1 * | 8/2003 | Sehmbey et al. | 165/80.3 |
| 2003/0183369 A1 | 10/2003 | Makaran | |
| 2004/0031588 A1 | 2/2004 | Makaran | |
| 2009/0107655 A1 | 4/2009 | Kajiura | |
| 2009/0126916 A1 * | 5/2009 | Yoshino | 165/149 |
| 2010/0172104 A1 * | 7/2010 | Yoshida et al. | 361/717 |
| 2010/0218922 A1 * | 9/2010 | Paulik et al. | 165/148 |
| 2010/0276135 A1 * | 11/2010 | Morino et al. | 165/185 |

FOREIGN PATENT DOCUMENTS

| | | |
|---|---|---|
| JP | 11-218368 A | 8/1999 |
| JP | 2001-255093 A | 9/2001 |
| JP | 2003-042677 A | 2/2003 |
| JP | 2003-075088 A | 3/2003 |
| JP | 2004-020108 A | 1/2004 |
| JP | 2004-259980 A | 9/2004 |
| JP | 2005-522036 A | 7/2005 |
| JP | 2009-105325 A | 5/2009 |
| JP | 2011-243608 A | 12/2011 |
| JP | 2012-015389 A | 1/2012 |

* cited by examiner

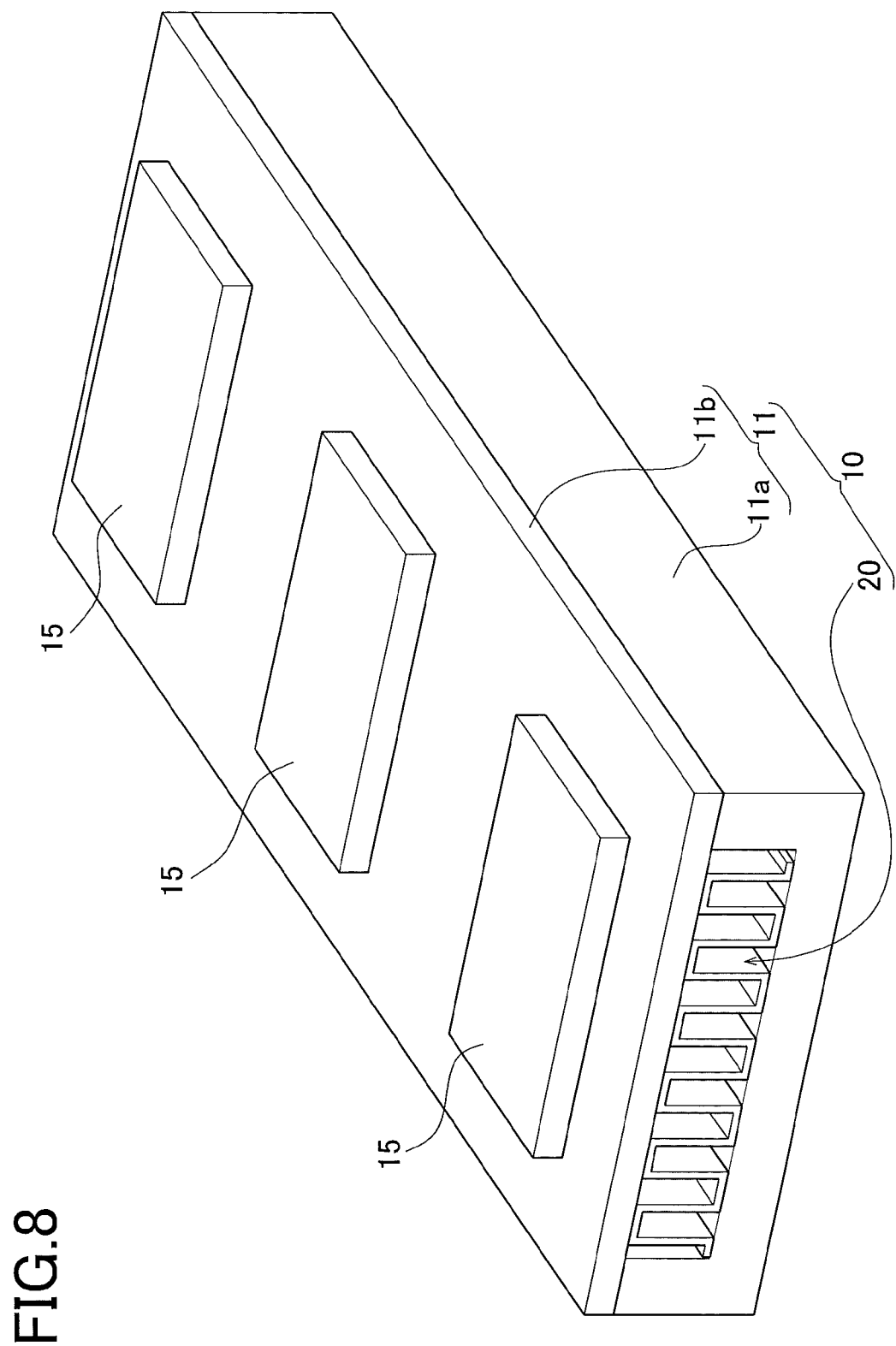

HEAT EXCHANGER AND METHOD FOR MANUFACTURING SAME

CROSS-REFERENCE TO RELATED APPLICATIONS

This is a 371 national phase application of PCT/JP2010/059119 filed on 28 May 2010, the entire contents of which are incorporated herein by reference.

TECHNICAL FIELD

The present invention relates to a heat exchanger provided with a plurality of corrugated plate-like fins and a method of manufacturing the heat exchanger and, more particularly, to a heat exchanger in which adjacent fins are placed in offset arrangement.

BACKGROUND ART

Heat generating elements such as power modules for high pressure resistance and large current to be mounted in a hybrid vehicle, an electric vehicle, and others generate a large self-heating value or amount during operation of semiconductor elements. Accordingly, such a heat generating element has to include a cooling structure having high heat dissipation performance. That is, a heat exchanger is required to efficiently dissipate heat from the heat generating element.

In one of the heat exchangers, adjacent fins are placed in offset arrangement (with displacement of peaks and roots between adjacent fins) (see Patent Document 1). In this heat exchanger, the fins are offset arranged, causing a turbulent flow of coolant (cooling medium) to avoid the generation of a boundary layer in the coolant, so that a heat transfer coefficient between the fins and the coolant is improved.

For the above heat exchanger, particularly, it is necessary to accurately position the fins in place. If an offset amount of the fins deviates from a design value, the boundary layer occurs in the coolant. This results in a disadvantage that could not improve the heat transfer coefficient between the fins and the coolant.

It is therefore necessary to hold each fin in a predetermined position, i.e., position each fin in place. In one heat exchanger, such a fin positioning mechanism is provided for example by a protrusion and a recess each formed in a holding member that holds the fins (see Patent Document 2).

RELATED ART DOCUMENTS

Patent Documents

Patent Document 1: JP-A-2004-20108
Patent Document 2: JP-A-5 (1993)-340686

SUMMARY OF INVENTION

Problems to be Solved by the Invention

However, the above heat exchanger needs the fin positioning mechanism for each fin. In a case where the fins are placed in offset arrangement to perform efficient heat exchange, a plurality of positioning mechanisms have to be provided. Many portions of the holding member need to be processed, resulting in a complicated shape of the holding member, and decreasing a productive efficiency due to troublesome fin-placing work. This leads to an increased product cost.

The present invention has been made to solve the above problems and has a purpose to provide a heat exchanger capable of performing efficient heat exchange, in which fins are easily and accurately positioned without increasing a manufacturing cost, and a method of manufacturing the heat exchanger.

Means of Solving the Problems

To achieve the above purpose, one aspect of the invention provides a heat exchanger in which a plurality of corrugated plate-like fins are placed in a housing in a flow direction of coolant, the heat exchanger including: a connecting part that connects adjacent ones of the fins; a protrusion formed in the connecting part; and a positioning hole formed in the housing and obliquely with respect to the flow direction of coolant to position the fins in place, the protrusion being fitted in the positioning hole so that the adjacent fins are placed at a predetermined interval in the flow direction of coolant and one end of a cooling fin contacts with a side surface of the housing so that the adjacent fins are arranged with a predetermined offset amount in a direction perpendicular to the flow direction of coolant.

In this heat exchanger, the protrusion of the connecting part is fitted in the positioning hole of the housing, so that the adjacent fins are placed at the predetermined interval in the coolant flow direction and with the predetermined offset amount in the direction perpendicular to the coolant flow direction. Since the protrusion is fitted in the positioning hole as above, positioning of the fins can be easily and accurately achieved. The adjacent fins are placed with the predetermined offset amount in the direction perpendicular to the coolant flow direction, and thus the coolant is made turbulent, avoiding the generation of a boundary layer in the coolant. This can enhance a heat transfer coefficient between the fins and the coolant. Efficient heat exchange can be performed accordingly.

In this heat exchanger, furthermore, the positioning mechanism is provided in the connecting part. Thus, the number of fin positioning mechanisms can be reduced than in a conventional heat exchanger. The housing is simply provided with the positioning hole as the positioning mechanism, so that the shape of the housing is not complicated. Moreover, since the adjacent fins are connected with each other, placing the fins in the housing can be facilitated. From the above configuration, this heat exchanger can prevent an increase in manufacturing cost.

In the heat exchanger, preferably, the positioning hole is formed in a bottom of the housing.

The bottom side of the housing indicates an opposite side from a surface on which a heat generating element is to be mounted (a top plate side).

If the positioning hole is provided in the top plate of the housing, the flatness of the top plate could not be ensured and thus the heat generating element mounted on the heat exchanger may come off or be separated therefrom (including partial separation). When the heat generating element is completely separated from the heat exchanger, the heat generating element could not be efficiently cooled. Therefore, the positioning hole is formed in the bottom of the housing so that the heat generating element can be prevented from coming off from the heat exchanger, thus enabling efficient cooling of the heat generating element.

In the above heat exchanger, preferably, he connecting part and the protrusion are integrally formed with the adjacent fins.

Furthermore, it is preferable that the adjacent fins are made of a plate-like member in such a way that a portion of the plate-like member present between portions that will form the adjacent fins is punched out while leaving a portion that will form the connecting part and the protrusion, and the portions that will form the adjacent fins are folded into a corrugated shape.

Since the connecting part and the protrusion are integrally formed with the adjacent fins as above, the connecting part and the protrusion do not need to be provided as separate additional components. The portion of the plate-like member present between the portions that will form the adjacent fins is punched out from the plate-like member so that portions that will form the connecting part and the protrusion are left, and the portions intended to form the adjacent fins are folded into a corrugated shape, thereby forming adjacent fins. In this manner, the fins, connecting parts, and protrusions, can be easily made. The above configuration can improve the productive efficiency of the heat exchanger. This reliably prevents an increase in manufacturing cost.

Another aspect of the invention to achieve the above purpose provides a method of manufacturing a heat exchanger in which a plurality of corrugated plate-like fins are placed in a housing in a flow direction of coolant, the method including: a housing forming step of forming the housing and a positioning hole for positioning the fins in place; a fin forming step of forming the fins; and a fin placing step of placing the fins formed in the fin forming step into the housing formed in the housing forming step, wherein the fin forming step includes punching out a portion of a plate-like member present between portions that will form the adjacent fins while leaving a portion that will form a connecting part and a protrusion, and folding the portions that will form the fins into a corrugated shape, and the fin placing step includes fitting the protrusion into the positioning hole to place the adjacent fins at a predetermined interval in a flow direction of coolant and with a predetermined offset amount in a direction perpendicular to the flow direction of coolant.

In this manufacturing method of the heat exchanger, in the housing forming step, the positioning hole is formed at the time when the housing is produced. In the fin forming step, before a single plate-like member is folded into a corrugated shape to form adjacent fins, the portion of the plate-like member present between the portions to be formed as the fins is punched out so that the connecting part for connecting the adjacent fins and the protrusion that is to be fitted in the positioning hole are left, thereby forming the connecting part and the protrusion. Specifically, at the time when the fins are formed, the connecting part and the protrusion are formed. Accordingly, there is no need to add any step of forming the positioning hole, protrusion, and connecting part which serve as a fin positioning mechanism. It is therefore reliably possible to prevent an increase in manufacturing cost.

According to the heat exchanger manufactured by the above manufacturing method, when the protrusion is fitted in the positioning hole, positioning of the fins can be simply and accurately positioned in place. The adjacent fins are placed at a predetermined offset amount in the direction perpendicular to the coolant flow direction. This configuration reliably generates a turbulent flow of the coolant and avoids the generation of a boundary layer in the coolant. Thus, the heat transfer coefficient between the fins and the coolant can be enhanced. Accordingly, efficient heat exchange can be performed.

Effects of the Invention

According to the heat exchanger and the manufacturing method thereof according to the present invention, as described above, the fins can be easily and accurately positioned in place without increasing a manufacturing cost, and efficient heat exchange can be performed.

BRIEF DESCRIPTION OF THE DRAWINGS

FIG. 8 is a diagram showing a usage state of the heat exchanger in the present embodiment.

MODE FOR CARRYING OUT THE INVENTION

A detailed description of a preferred embodiment of a heat exchanger and a manufacturing method thereof embodying the present invention will now be given referring to the accompanying drawings. This embodiment exemplifies a case where the present invention is applied to a heat exchanger for cooling a semiconductor element constituting an inverter circuit.

Figure 1:
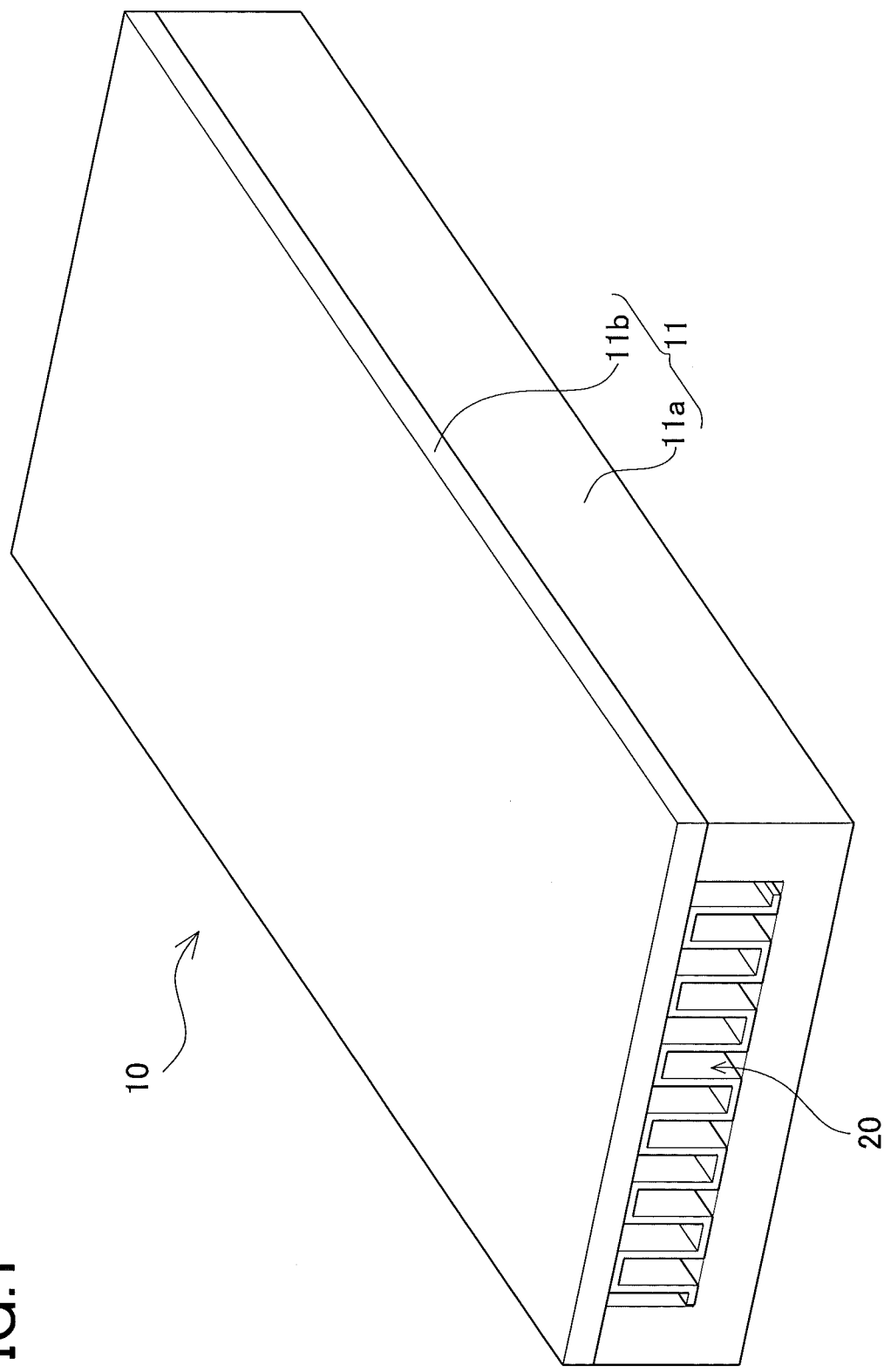
FIG. 1 is a perspective view showing a schematic configuration of a heat exchanger in an embodiment.
Figure 2:
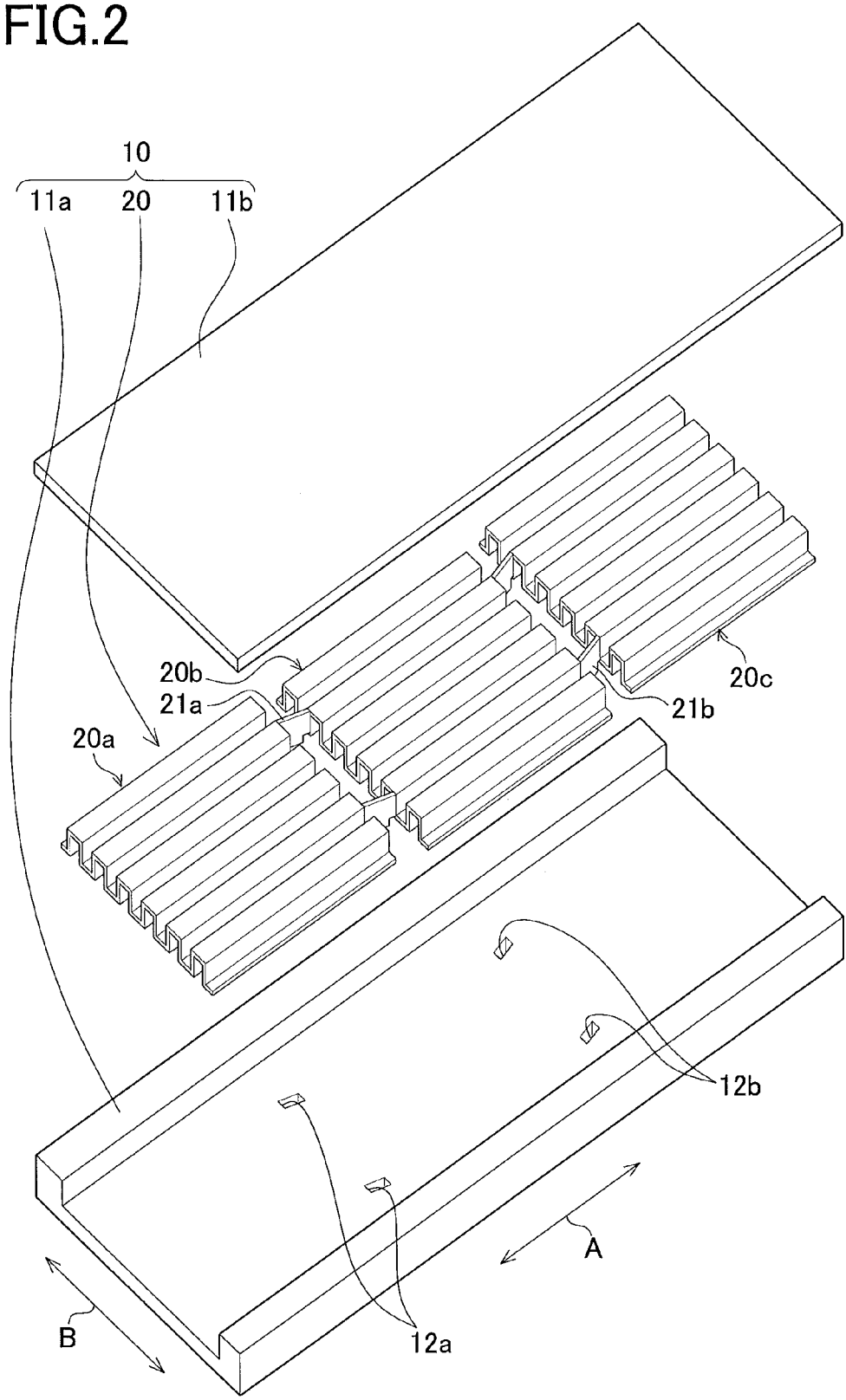
FIG. 2 is an exploded perspective view of the heat exchanger shown in FIG. 1.
Figure 3:
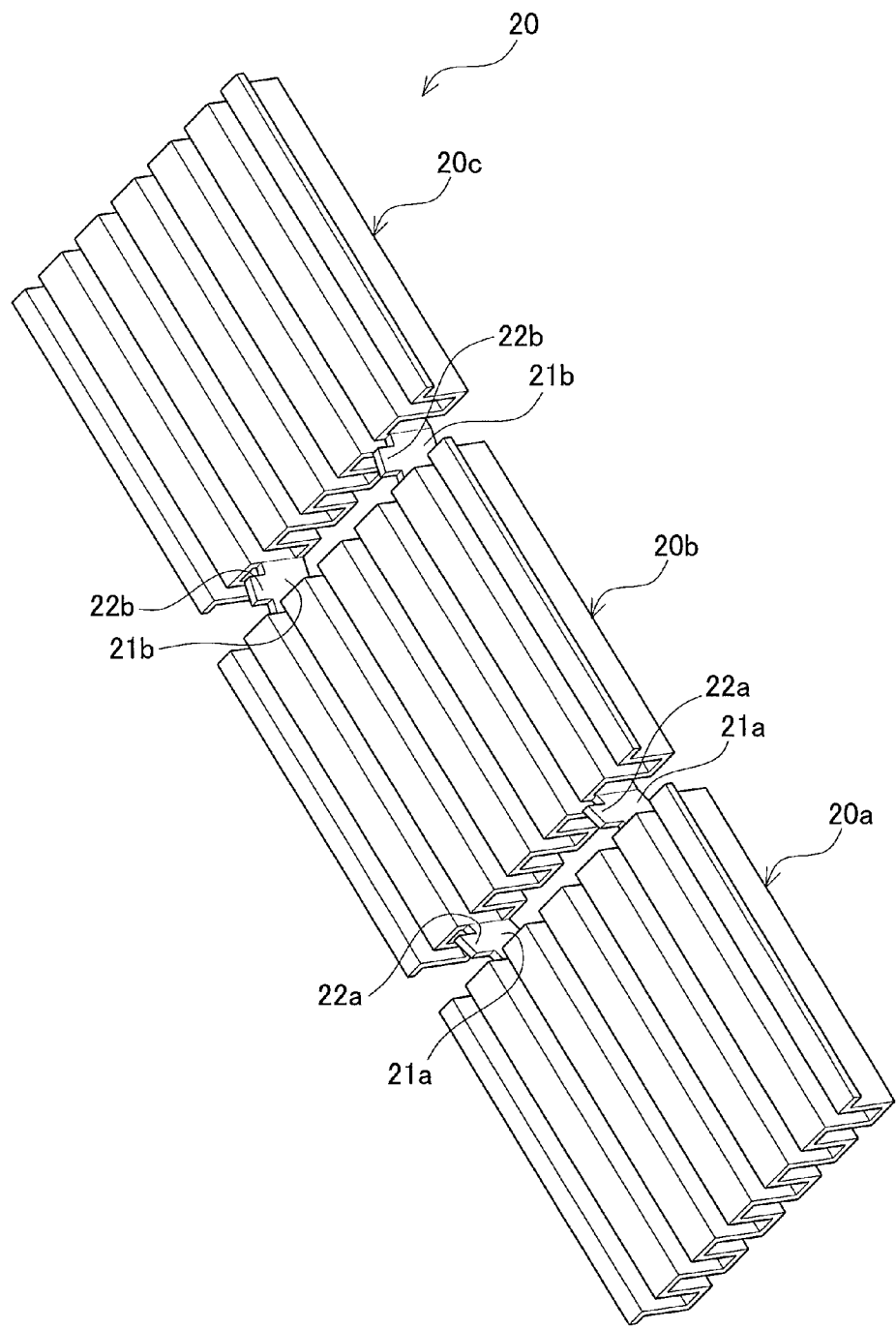
FIG. 3 is a perspective view of a cooling fin seen from a bottom side.

Therefore, the heat exchanger in this embodiment will be explained referring to FIGS. 1 to 3. FIG. 1 is a perspective view showing a schematic configuration of the heat exchanger in the present embodiment. FIG. 2 is an exploded perspective view of the heat exchanger shown in FIG. 1. FIG. 3 is a perspective view of a cooling fin seen from a bottom side.

A heat exchanger 10 in the present embodiment includes, as shown in FIG. 1, a hollow housing 11 and a cooling fin 20 accommodated in the housing 11. The cooling fin 20 partitions the hollow space of the housing 11 to form flow passages for coolant. In the present embodiment, the cooling fin 20 includes three fins 20a, 20b, and 20c in the housing 11 as shown in FIG. 2.

The fins 20a to 20c are arranged at predetermined intervals in a flow direction (direction A) of the coolant. The adjacent fins 20a and 20b are displaced from each other and the adjacent fins 20b and 20c are also displaced from each other with a predetermined offset amount in a direction (direction B) perpendicular to the coolant flow direction. In other words, the fins 20a and 20c are placed with a displacement from the fin 20b. The fins 20a to 20c have the same shape and made of a rolled sheet folded into a corrugated shape. The fins 20a to 20c are connected integrally to each other with connecting parts 21a and 21b, thus forming the cooling fin 20. The connecting parts 21a and 21b are respectively provided with protrusions 22a and 22b engageable with positioning holes 12a and 12b which will be mentioned later in order to position the fins 20a to 20c in place.

The above protrusions 22a and 22b and positioning holes 12a and 12b constitute a positioning mechanism for positioning each fin 20a to 20c with respect to the housing 11 (a frame 11a in the present embodiment). In the heat exchanger 10, specifically, the positioning mechanism is provided between the adjacent fins. Accordingly, it is unnecessary to provide a positioning mechanism for each fin as in the conventional heat exchanger with the fins placed in offset arrangement. The number of fin positioning mechanisms can thus be reduced. This can also prevent an increase manufacturing cost.

The connecting part 21a serves to connect the fins 20a and 20b, and the present embodiment provides two connecting parts 21a. Similarly, the connecting part 21b serves to connect the fins 20b and 20c, and the present embodiment provides two connecting parts 21b. The number of connecting parts 21a and the number of connecting parts 22b have to be at least one but are preferably two or more. This is because two or more connecting parts 21a and two or more connecting parts 22b enable more accurate positioning of the fins 20a to 20c.

The housing 11 in which the aforementioned cooling fin 20 is accommodated includes the frame 11a having a nearly angular U-shaped cross section defined by a bottom and side surfaces of the housing 11, and a top plate 11b covering the frame 11a and forming an upper surface of the housing 11. The top plate 11b is fixed to the frame 11a, thus making the housing 11 hollow. While the fins 20a to 20c are set in the frame 11a, the top plate 11b is brazed to the frame 11a, so that the cooling fin 20 is accommodated in the housing 11. At that time, the cooling fin 20 is brazed to the housing 11. Thus, the hollow space of the housing 11 is partitioned by the cooling fin 20 to form the flow passages for coolant. One open end of the housing 11 serves as an inlet port through which the coolant flows in the housing 11, while the other open end of the housing 11 serves as an outlet port through which the coolant flows out of the housing 11.

The bottom of the frame 11a is formed with the positioning holes 12a and 12b to position the fins 20a to 20c in place. As above, the frame 11a is simply formed with the positioning holes 12a and 12b serving as a positioning mechanism for the cooling fin 20 (the fins 20a to 20c). This needs no complicated shape of the frame 11a. Those positioning holes 12a and 12b are bottom-closed slit-like holes in which the protrusions 22a and 22b of the connecting parts 21a and 21b are fitted. The positioning holes 12a and 12b are provided in positions on which the fins 20a to 20c are not disposed. Specifically, the positioning holes 12a are formed between the adjacent fins 20a and 20b and the positioning holes 12b are formed between the adjacent fins 20b and 20c.

It is to be noted that the positioning holes 12a and 12b may be formed in the top plate 11b, but are preferably formed in the frame 11a for the following reason. On this top plate 11b, semiconductor elements 15 will be mounted as mentioned later. Therefore, if the positioning holes 12a and 12b are formed in the top plate 11b and thus this top plate 11b cannot provide the flatness, the semiconductor elements 15 may come off or be separated (including partial separation) from the top plate 11b. If the semiconductor elements 15 come off from the top plate 11b, the semiconductor elements 15 could not be efficiently cooled by the heat exchanger 10. In the present embodiment, therefore, the positioning holes 12a and 12b are provided in the frame 11a to ensure the flatness of the top plate 11b.

The positioning holes 12a and 12b are arranged obliquely with respect to the coolant flow direction (direction A). The arrangement direction of the positioning holes 12a is reversed from that of the positioning holes 12b. Accordingly, when the protrusions 22a and 22b of the connecting parts 21a and 21b of the cooling fin 20 are respectively fitted in the positioning holes 12a and 12b, the adjacent fins 20a and 20b are arranged offset from each other and the adjacent fins 20b and 20c are arranged offset from each other in the direction (direction B) perpendicular to the coolant flow direction. The adjacent fins 20a and 20b and the adjacent fins 20b and 20c are connected with each other by the connecting parts 21a and 21b, so that they are arranged at predetermined intervals in the coolant flow direction (direction A). The interval and the offset amount between the adjacent fins can be adjusted by changing the size (length) of the connecting parts 21a and 21b and the arrangement angles of the positioning holes 12a and 12b.

Figure 4:
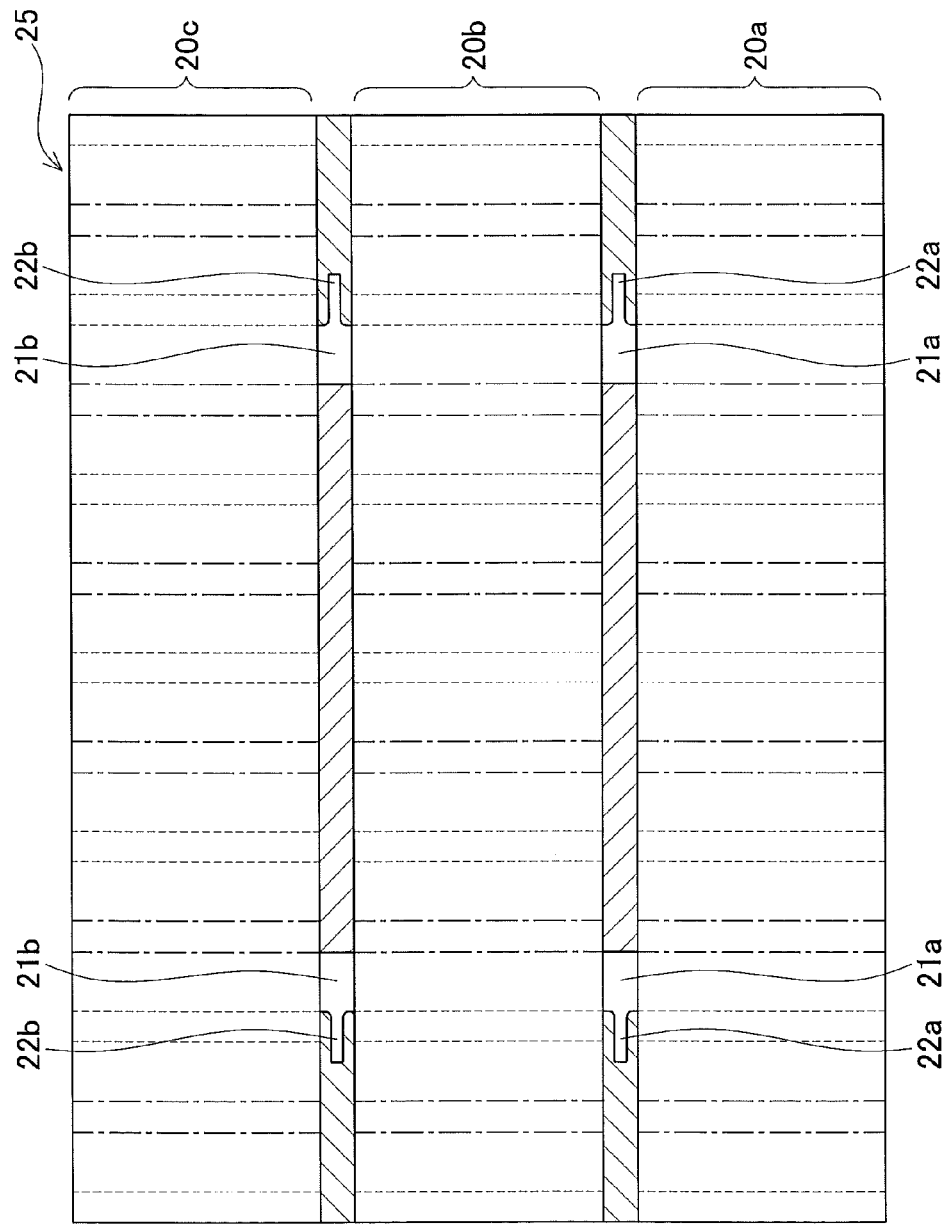
FIG. 4 is a schematic diagram showing a schematic configuration of a rolled sheet before the cooling fin is made.
Figure 5:
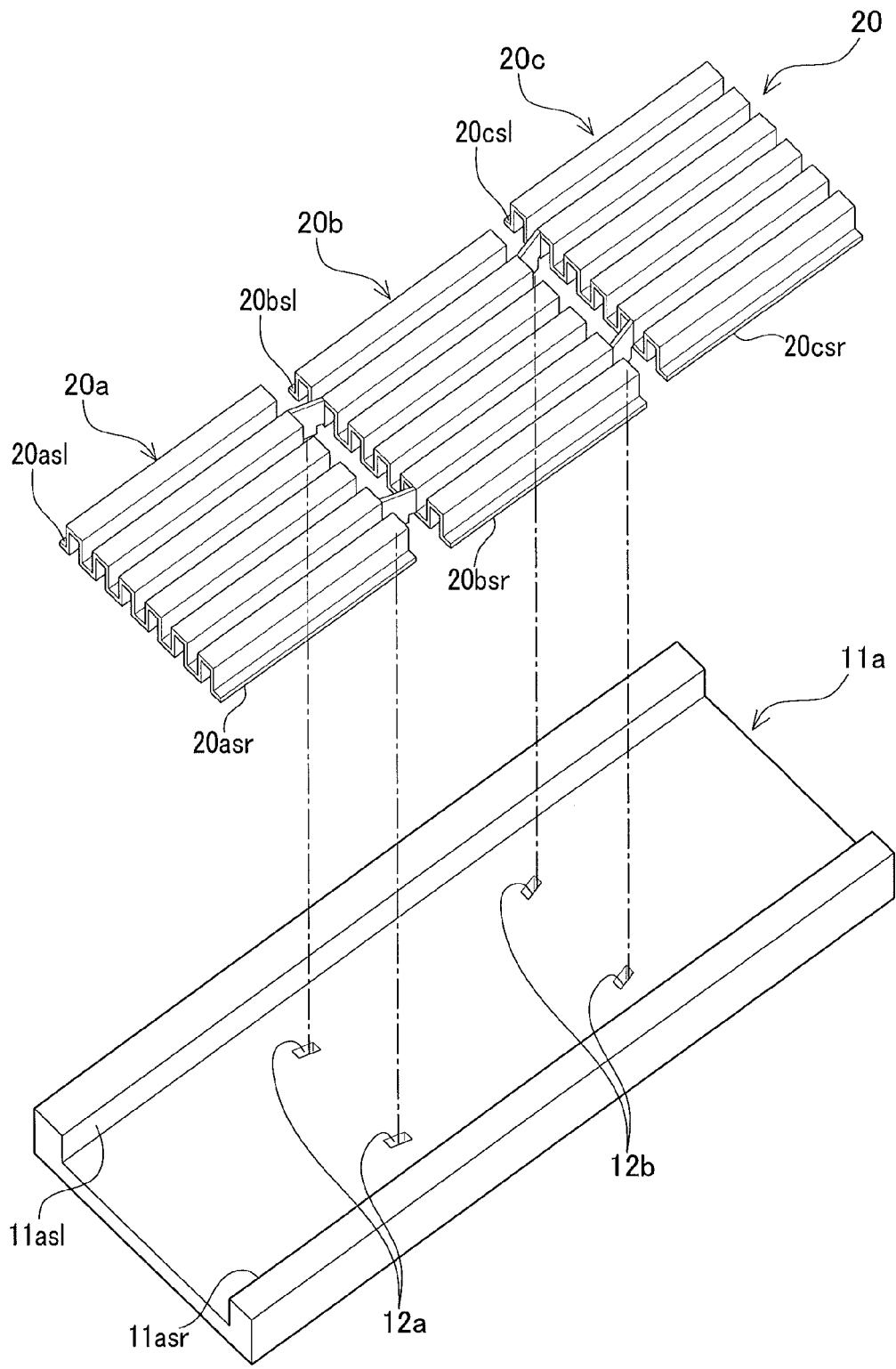
FIG. 5 is a diagram showing how to place the cooling fin in a housing.
Figure 6:
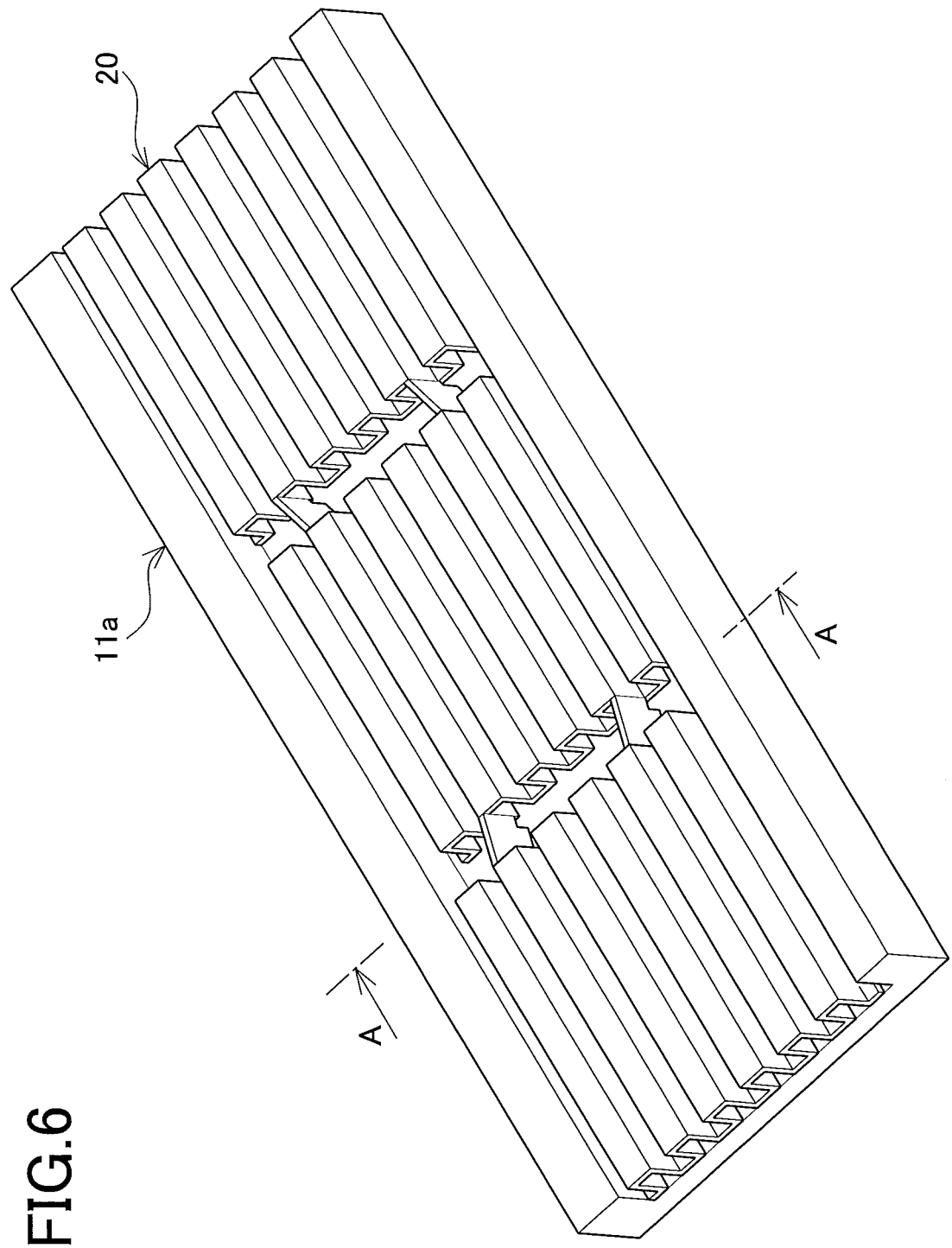
FIG. 6 is a diagram showing a state where the cooling fin is placed in the housing.
Figure 7:
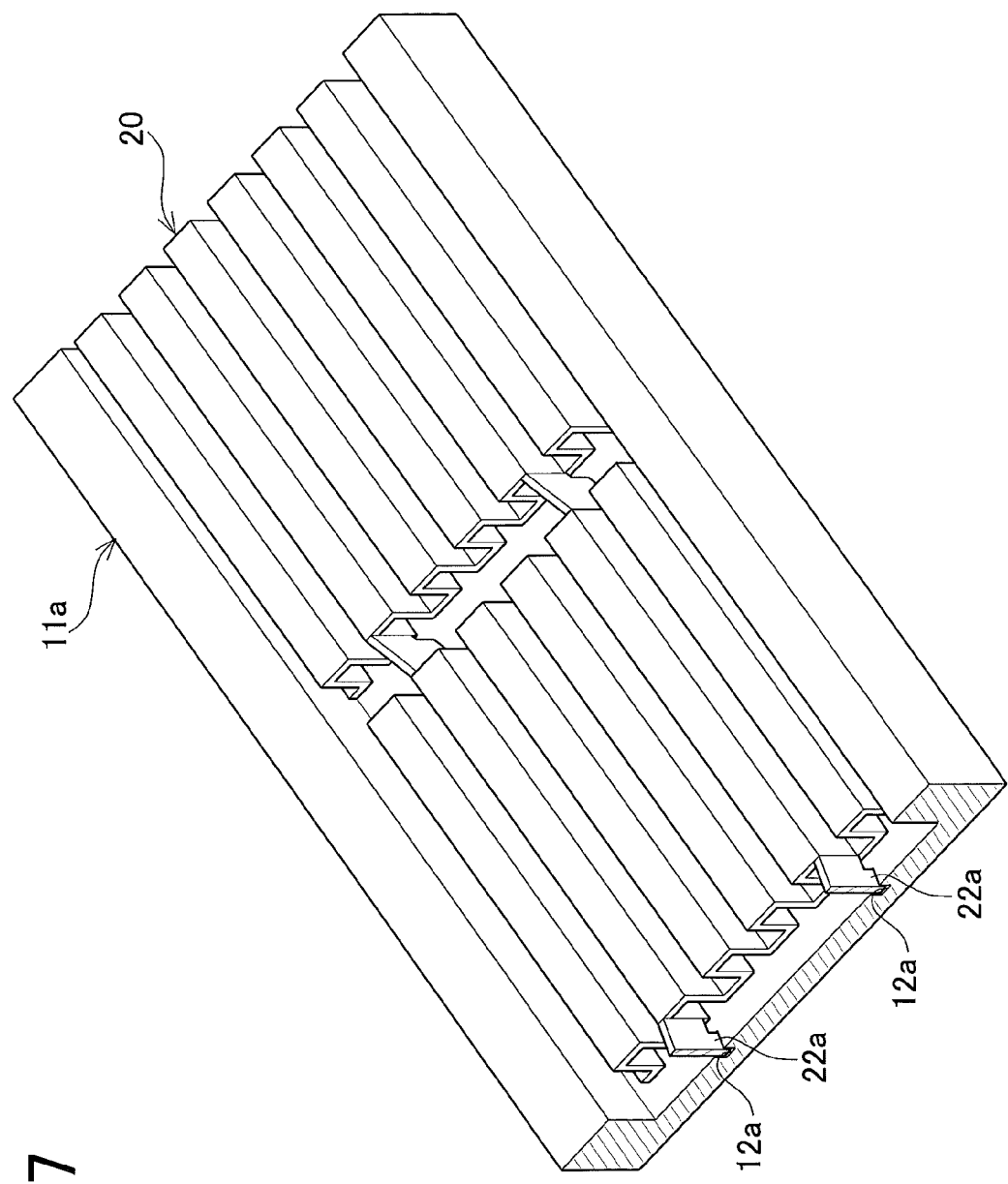
FIG. 7 is a perspective view taken along a line A-A in FIG. 6.

A method of manufacturing the heat exchanger 10 configured as above will be described below referring to FIGS. 4 to 7. FIG. 4 is a schematic diagram showing a schematic configuration of a rolled sheet before the cooling fin is made. FIG. 5 is a diagram showing how to place the cooling fin in the housing. FIG. 6 is a diagram showing a state where the cooling fin is placed in the housing. FIG. 7 is a perspective view taken along a line A-A in FIG. 6.

A manufacturing process of this heat exchanger 10 includes a housing forming step of forming the housing 11, a fin forming step of forming the cooling fin 20, and a fin placing step of placing the cooling fin 20 in the housing 11 (the frame 11a in this embodiment).

In the housing forming step, a metal plate or sheet is formed into a nearly angular U shape in cross section and also the positioning holes 12a and 12b are formed by press or other techniques, thus producing the frame 11a. Since the positioning holes 12a and 12b are formed at the same time when the frame 11a is produced as above, the frame 11a provided with the positioning holes 12a and 12b neither lowers the productive efficiency nor increases the manufacturing cost. In this step, additionally, a metal plate is machined into a predetermined size to form the top plate 11a. In the housing forming step, the frame 11a and the top plate 11b constituting the housing 11 are thus formed. Fixing (brazing) the top plate 11b to the frame 11a is performed after the fin placing step.

In the fin forming step, the cooling fin 20 is made from a rolled sheet to include the three fins 20a to 20c, the connecting parts 21a and 21b, and the protrusions 22a and 22b. To be concrete, as shown in FIG. 4, portions (hatched portions in FIG. 4) of a rolled sheet 25 excepting portions which will form the fins 20a to 20c, connecting parts 21a and 21b, and protrusions 22a and 22b are punched (removed) out from the rolled sheet 25 having a predetermined size, and the portions which will form the fins 20a to 20c are folded into a corrugated shape. In the present embodiment, the portions which will form the fins 20a to 20c are folded along a chain line to make a mountain fold and along a broken line to make a valley fold shown in FIG. 4. Thereafter, the fins 20b are made offset from the fins 20a and 20c. The cooling fin 20 is thus completed as shown in FIGS. 2 and 3.

In the fin forming step, as mentioned above, the three fins 20a to 20c are simultaneously formed, so that the fin productive efficiency can be increased. Since the connecting parts 21a and 21b and the protrusions 22a and 22b are formed integral with the fins 20a to 20c, the cooling fin 20 provided with the connecting parts 21a and 21b and the protrusions 22a and 22b does not lower the fin productive efficiency. From the above point of view, even when the connecting parts 21a and 21b and the protrusions 22a and 22b are provided, a cost rise of the heat exchanger 10 can be avoided.

In the fin placing step, the fins 20a to 20c are placed in the frame 11a. To be concrete, as shown in FIG. 5, the frame 11a and the cooling fin 20 are placed so that the positioning holes 12a and 12b formed in the frame 11a face the protrusions 22a and 22b formed in the connecting parts 21a and 21b. From this state shown in FIG. 5, the protrusions 22a and 22b are fitted into the positioning holes 12a and 12b, thereby placing the fins 20a to 20c in the frame 11a. Herein, the fins 20a to 20c are connected integrally through the connecting parts 21a and 21b and constitute the cooling fin 20. This configuration does not need to place the three fins 20a to 20c individually and thus extremely facilitates the work of placing the fins. Accordingly, the productive efficiency of the heat exchanger 10 can be enhanced. This advantage also contributes to prevent an increase in cost of the heat exchanger 10.

As shown in FIG. 7, when the protrusions 22a and 22b are fitted in the positioning holes 12a and 12b obliquely arranged, an end 20asl of the fin 20a comes into contact with a side surface 11asl of the frame 11a, an end 20bsr of the fin 20b comes into contact with a side surface 11asr of the frame 11a, and an end 20csl of the fin 20c comes into contact with the side surface 11asl of the frame 11a. Accordingly, as shown in FIG. 6, the adjacent fins 20 to 20c are arranged at intervals corresponding to a design value in the coolant flow direction (direction A) and in offset positions corresponding to design values in the direction (direction B) perpendicular to the coolant flow direction. As above, positioning of each of the fins 20a to 20c can be achieved easily and accurately. An end 20asr of the fin 20a and an end 20csr of the fin 20c are both out of contact with the side surface 11asr of the frame 11a, and an end 20bsl of the fin 20b is out of contact with the side surface 11asl of the fin 11a.

Thereafter, the top plate 11b is fixed to the frame 11a in which the cooling fin 20 is placed. Herein, the inner surfaces of the frame 11a and the top plate 11b, i.e., respective surfaces that contact with the cooling fin 20, are applied with brazing metal in advance. When these frame 11a and top plate 11b in such a state are heated, the top plate 11b is brazed to the frame 11a and also the cooling fin 20 is brazed to the frame 11a and the top plate 11b. In this manner, the heat exchanger 10 shown in FIG. 1 is completed.

Operations and advantageous effects of the above described heat exchanger 10 will be explained referring to FIG. 8. FIG. 8 is a diagram showing a usage state of the heat exchanger in the present embodiment. The heat exchanger 10 is used in a state that the semiconductor elements 15 which are heat generating elements are mounted on the top plate 11b as shown in FIG. 8. Even though FIG. 8 shows a case where three semiconductor elements 15 are arranged, the number of semiconductor elements 15 is not limited thereto.

In this heat exchanger 10, the heat generated from the semiconductor elements 15 is transferred to the cooling fin 20 through the top plate 11b. The heat transferred to the cooling fin 20 is then transferred to the coolant flowing inside the heat exchanger 10, thereby cooling the semiconductor elements 15. The coolant is supplied into the heat exchanger 10 through the open one end of the housing 11, flowing through the flow passages defined by the cooling fin 20 (the fins 20a to 20c), and is discharged out of the heat exchanger 10 through the other open end of the housing 11.

In the heat exchanger 10, the fins 20a to 20c are accurately positioned in place and displaced with the offset amount as designed. Accordingly, the coolant flowing in the heat exchanger 10 is reliably made turbulent and no boundary layer is generated in the coolant. This can efficiently perform heat exchange between the cooling fin 20 and the coolant. That is, the semiconductor elements 15 can be efficiently cooled.

According to the heat exchanger 10 in the present embodiment as described in detail above, the protrusions 22a and 22b formed in the connecting parts 21a and 21b provided respectively between the adjacent fins 20a and 20b and between the fins 20b and 20c are fitted in the positioning holes 12a and 12b provided in the frame 11a, the fins 20a to 20c are accurately positioned. Accordingly, the adjacent fins 20a and 20b and the adjacent fins 20b and 20c are placed with the predetermined offset amount in the direction (direction B) perpendicular to the coolant flow direction (direction A), thereby surely causing a turbulent flow of the coolant. Consequently, no boundary layer is formed in the coolant, so that a heat transfer coefficient between the fins 20a to 20c and the coolant can be enhanced and the heat exchange therebetween can be efficiently performed.

In the heat exchanger 10, furthermore, the positioning mechanisms are provided in the connecting parts 21a and 21b. Thus, the number of fin positioning mechanisms can be reduced than in the conventional heat exchanger. Since the frame 11a is simply provided with the positioning holes 12a and 12b serving as the positioning mechanism, the frame 11a does not need to have a complicated shape. Furthermore, the adjacent fins 20a and 20b and the adjacent fins 20b and 20c are connected by the connecting parts 21a and 21b, so that the work to place the fins 20a to 20c in the frame 11a is facilitated. From above, an increase in manufacturing cost can be prevented.

The above embodiment is a mere example and does not limit the present invention. The present invention may be embodied in other specific forms without departing from the essential characteristics thereof. For instance, although the above embodiment shows the case where the invention is applied to the heat exchanger for cooling the semiconductor elements constituting the inverter circuit, the invention is not limited thereto and may be widely applied to any heat exchangers for cooling heating elements.

REFERENCE SIGNS LIST

10 Heat exchanger
11 Housing
11a Frame
11b Top plate
15 Semiconductor element
20 Cooling fin
20a to 20c Fin
21a, 21b Connecting part
22a, 22b Protrusion
25 Rolled sheet

The invention claimed is:

1. A heat exchanger in which a plurality of corrugated plate-like fins are placed in a housing in a flow direction of coolant, the heat exchanger including:
   a connecting part that connects adjacent ones of the fins;
   a protrusion formed in the connecting part; and
   a positioning hole formed in the housing and obliquely with respect to the flow direction of coolant to position the fins in place,
   the protrusion being fitted in the positioning hole so that the adjacent fins are placed at a predetermined interval in the flow direction of coolant and one end of a cooling fin contacts with a side surface of the housing so that the adjacent fins are arranged with a predetermined offset amount in a direction perpendicular to the flow direction of coolant.

2. The heat exchanger according to claim 1, wherein the positioning hole is formed in a bottom of the housing.

3. The heat exchanger according to claim 1, wherein the connecting part and the protrusion are integrally formed with the adjacent fins.

4. The heat exchanger according to claim 3, wherein the adjacent fins are made of a plate-like member in such a way that a portion of the plate-like member present between portions that will form the adjacent fins is punched out while leaving a portion that will form the connecting part and the protrusion, and the portions that will form the adjacent fins are folded into a corrugated shape.

5. A method of manufacturing a heat exchanger in which a plurality of corrugated plate-like fins are placed in a housing in a flow direction of coolant, the method including:
- a housing forming step of forming the housing and a positioning hole for positioning the fins in place;
- a fin forming step of forming the fins; and
- a fin placing step of placing the fins formed in the fin forming step into the housing formed in the housing forming step,
- wherein the fin forming step includes punching out a portion of a plate-like member present between portions that will form the adjacent fins while leaving a portion that will form a connecting part and a protrusion, and folding the portions that will form the fins into a corrugated shape, and
- the fin placing step includes fitting the protrusion into the positioning hole to place the adjacent fins at a predetermined interval in a flow direction of coolant and with a predetermined offset amount in a direction perpendicular to the flow direction of coolant.

* * * * *